United States Patent [19]
Dixon

[11] Patent Number: 5,202,642
[45] Date of Patent: Apr. 13, 1993

[54] APPARATUS AND METHOD FOR FRACTIONAL FREQUENCY DIVISION

[75] Inventor: Glenn B. Dixon, Roy, Utah

[73] Assignee: Iomega Corporation, Roy, Utah

[21] Appl. No.: 697,797

[22] Filed: May 9, 1991

[51] Int. Cl.$^5$ .................... G06F 1/04; H03K 5/153
[52] U.S. Cl. ................................ 328/014; 328/61; 377/48
[58] Field of Search ............... 377/48, 49, 51; 328/14

[56] References Cited

U.S. PATENT DOCUMENTS

| | | | |
|---|---|---|---|
| 3,603,773 | 7/1971 | Carlstein | 377/44 |
| 3,976,945 | 8/1976 | Cox | 377/48 |
| 4,231,104 | 10/1980 | St. Clair | 377/48 |
| 4,559,613 | 12/1985 | Murphy et al. | 377/48 |
| 4,792,914 | 12/1988 | Dartois et al. | 328/14 |
| 4,809,221 | 2/1989 | Magliocco et al. | 377/48 |
| 4,965,531 | 10/1990 | Riley | 328/14 |
| 4,991,188 | 2/1991 | Perkins | 377/49 |
| 5,039,872 | 8/1991 | Oldham | 328/14 |
| 5,040,197 | 8/1991 | Theobald | 377/48 |

OTHER PUBLICATIONS

Ulrich Rhode, Digital PLL Frequency Synthesis Prentice-Hall, 1983, p. 110.
Zaurel, "A direct Digital Synthesis VFO", Ham Radio, Sep. 1988, pp. 10-17.

*Primary Examiner*—John S. Heyman
*Attorney, Agent, or Firm*—Woodcock Washburn Kurtz Mackiewicz & Norris

[57] ABSTRACT

The present invention provides fractional frequency dividers using inexpensive digital components in a relatively simple circuit for producing a substantially spectrally pure clock signal, free of significant time or phase jitter. The synthesizer and method include a reference frequency register for providing a frequency set value, which frequency set value is proportional to the desired frequency, a summer, having a finite storage capacity, for adding the frequency set value to a stored summed value to form a new summed value which new summed value is stored as the summed value. A carry signal is generated when the new summed value exceeds the finite storage capacity. In that event, only that portion of the new summed value in excess of the finite storage capacity is stored as the summed value. A variable time delay clock generator generates the desired clock signal so that each pulse is generated in response to the carry signal and delayed by a delay period equal to the period of a master clock signal minus a fraction of the master period. This fraction is relative to both the summed value and the frequency set value. In the preferred embodiment the frequency set value is equal to the desired frequency divided by the master frequency times a constant, which constant is related to the finite storage capacity and the fraction is equal to the summed value divided by the frequency set value.

16 Claims, 4 Drawing Sheets

APPARATUS AND METHOD FOR FRACTIONAL FREQUENCY DIVISION

FIELD OF THE INVENTION

The present invention relates to the field of frequency synthesizers and, more particularly, to methods and apparatus for generating clock signals at selected frequencies which are generated by dividing the frequency of a given master or reference clock signal.

BACKGROUND OF THE INVENTION

Fractional frequency division is a technique for producing an output signal of desired frequency by dividing an input signal of known and preferably regulated frequency "f" by a number "k" to generate an output signal of lower, desired frequency f/k. In the art, circuits incorporating this frequency division technique are known. The divider "k" can be either an integer division of the input signal frequency or can be any rational number. However, difficulties arise when the frequency of the output signal, i.e. the quotient, does not correspond to an integer subdivision of the frequency of the input signal. Such difficulties can include significant timing jitter or phase noise.

U.S. Pat. No. 3,603,773—Carlstein discloses a variable pulse generator for generating, from a fixed frequency source, a train of pulses having a frequency proportional to an input digital number. First and second registers are described, wherein a number stored in the first register is continuously added to a running total in the second register, i.e., a phase accumulator. The addition operation occurs at a frequency equal to the fixed frequency. A carry output from the second register to a pulse shaper is said to provide a variable frequency output, the frequency of which is determined by the magnitude of the number stored in the first register. When no variable time delay circuit or method is used in combination with the phase accumulator, as in the Carlstein device, a maximum timing jitter of one input clock period can occur and a timing jitter of one-half clock period is common.

Attempts have been made to provide fractional frequency synthesizers which utilized rational numbers but yet exhibit reduced timing jitter. U.S. Pat. No. 3,976,945—Cox discloses a frequency synthesizer incorporating a modulo-n counter, an accumulator, a cycle swallower and a programmable delay generator. It should be noted that the rational number (divisor) used in frequency synthesis can include an integer value portion and a fractional value portion. In Cox, the integer value portion is said to be applied to the modulo-n counter as the value "n" and the fractional value portion is set in the accumulator and added to a "running total" for each pulse of the input digital clock signal. The mudulo-n counter generates a trigger signal every "n" pulses of the input signal which trigger signal is provided to the programmable delay generator. The programmable delay generator generates an output signal for every trigger signal, which output signal is delayed in relation to the running total then present in the accumulator. Whenever the running total in the accumulator exceeds 1.0, a signal from the carry output of the accumulator is sent to the cycle swallower. Upon receipt of the carry signal, the cycle swallower swallows one pulse of the input signal, i.e. one input pulse is not provided to the modulo-n counter.

U.S. Pat. No. 4,231,104—St. Clair discloses a frequency synthesizer incorporating multiple memories, an adder, a counter and a delay line element. Operation is described in terms of clock period instead of frequency. Two memory devices are provided for separate storage of the integer value and fractional value portions of the rational number by which the period of the master clock signal is to be divided. An adder device generates a running total, wherein the total is incremented by the fractional value portion for each output of the counter, i.e. each time the counter counts a number of clock periods equal to the integer value portion. For every output of the counter, the delay line element delays the output signal by an amount equal to the running total. Whenever the running total in the adder exceeds 1.0, the counter is inhibited from counting for one count or one period of the master clock signal.

Unfortunately, these attempts to reduce timing jitter will still exhibit inherent timing jitter error equal to a maximum of $Tc/2^{M+1}$; where $Tc$ is the input clock period and $M$ is the number of bits used to generate the variable delay. Moreover, use of counter, pulse swallower and delay line circuits adds to the complexity of those frequency synthesizers resulting in increased manufacturing costs and increased probability of jitter and noise problems. It should also be noted that digital delay line devices are relatively expensive.

Other techniques have been attempted such as the phase lock loop synthesizer. Ulrich Rhode, *Digital PLL Frequency Synthesis*, Prentice-Hall 1983 p. 110. However, this method represents a compromise between frequency range, number of frequencies available, phase noise and complexity. In order to achieve a large number of possible synthesized frequencies with good phase noise and lock-in time, considerable complexity is required. In other words to achieve high frequency resolution and also to be able to quickly switch to a new frequency using PLL techniques, a device of considerable complexity is required.

Direct digital synthesis is still another method of generating or synthesizing a selected frequency. Robert J. Zaurel, "A Direct Digital Synthesis VFO"; *Ham Radio*, Sep. 1988, p. 10–17. This technique also uses a phase accumulator but provides the accumulator output to a ROM (Read-Only-Memory) look-up table instead of a variable time delay. The ROM is the limiting factor in the speed and cost of the circuit. Use of the ROM lookup table also produces a source of quantization error.

Consequently, a need still exists for a frequency synthesizer which can quickly switch from one frequency to another and which exhibits significantly less timing jitter or phase noise than prior devices.

SUMMARY OF THE INVENTION

The objects and advantages of the invention are achieved in a synthesizer and method for generating a clock signal having a desired frequency in relation to the master frequency of a master clock signal. Such synthesizer and method include a reference frequency register for providing a frequency set value, which frequency set value is proportional to the desired frequency, a summer, having a finite storage capacity, for adding the frequency set value to a stored summed value at each master clock to form a new summed value which new summed value is stored as the summed value. A carry signal is generated when the new summed value exceeds the finite storage capacity. In that event, only that portion of the new summed value in excess of the finite storage capacity is stored as the summed value. A variable time delay clock generator generates the desired clock signal so that each pulse is generated in response to the carry signal and delayed from the master clock edge by a delay period equal to the period of a master clock signal minus a fraction of the master period. This fraction is relative to both the summed value and the frequency set value. In the preferred embodiment the frequency set value is equal to the desired frequency divided by the master frequency times a constant, which constant is related to the finite storage capacity and the fraction is equal to the summed value divided, by the frequency set value.

BRIEF DESCRIPTION OF THE DRAWINGS

The present invention will be better understood and its numerous advantages will become apparent by references to the following detailed description of the invention when taken in conjunction with the following drawings in which.

DETAILED DESCRIPTION

Figure 1:
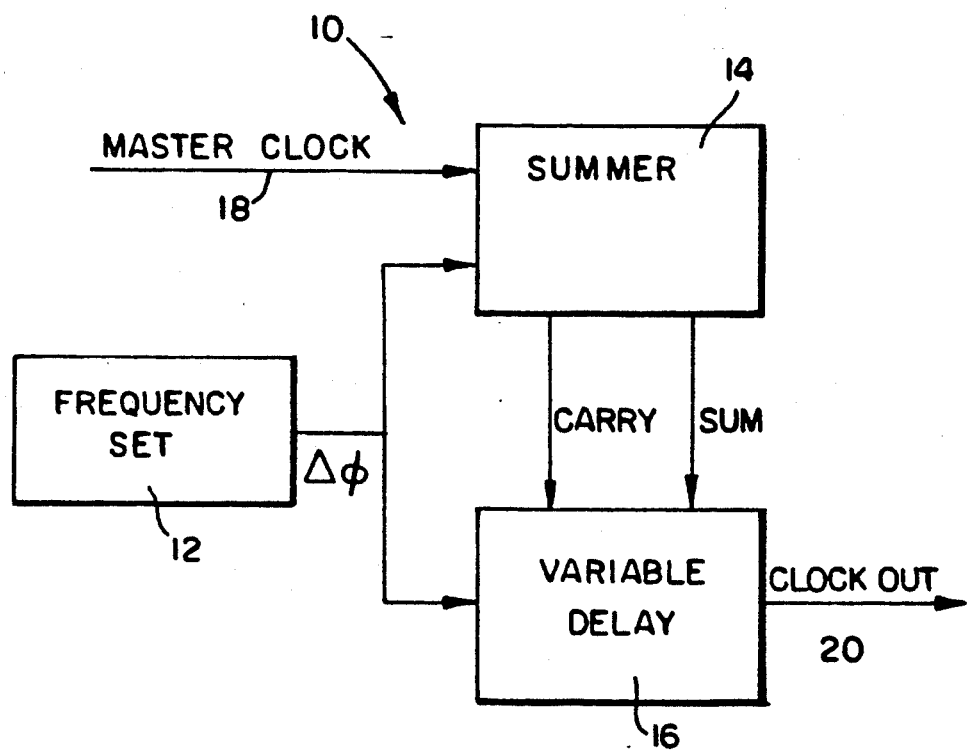
FIG. 1 is a block diagram of the preferred embodiment of the present invention.

A new and novel fractional frequency synthesizer is depicted in FIG. 1 and generally designated 10. Synthesizer 10 is shown to include a reference frequency register 12, a summer 14 and a variable time delayed clock generator 16. A master clock signal is provided at 18 to summer 14. The purpose of synthesizer 10 is the generation of a desired clock signal at output 20 which output signal has a desired frequency in proportion to the master frequency of the master clock signal.

In operation, the desired clock signal is generated by variable time delay clock generator 16. The reference frequency register 12 provides a stored frequency set value signal ($\Delta\phi$) which frequency set value is proportional to the desired frequency of the output signal. Summer 14 is connected to receive the frequency set value signal. Summer 14 adds the frequency set value to a summed value (SUM) which is stored in the summer at each master clock edge. The addition of the frequency set value to the summed value forms a new summed value. The new summed value is calculated in response to the master clock signal. After forming a new summed value, the new summed value is stored in summer 14 as the summed value.

Summer 14 is provided with storage capacity which is finite in nature. As will be explained in greater detail in relation to FIG. 2, the summer includes a digital memory which is "m" bits wide. When the new summed value is to be stored as the summed value and the new summed value is greater than the storage capacity of summer 14, i.e., greater than or equal to a value $2^m$, a carry signal is generated. When a carry signal is generated, only that portion of the new summed value which is greater than the storage capacity of summer 14 is stored as the summed value. The generation of the summed value to be stored at each carry signal can be represented by the following expression:

Stored Value=New Summed Value−$2^m$

Variable time delay clock generator 16 is connected to receive the summed value (SUM) stored in summer 14, the carry signal and the $\Delta\phi$ signal. Each pulse of the desired clock signal is generated by variable delay 16 in response to receipt of the carry signal. Each pulse to be generated is delayed for a delay period equal to the master period of the clock signal minus a fraction of such master period. The fraction is related to both the summed value and the frequency set value. The delay period can be represented by the following formula:

$$\text{Delay Period} = T_c\left(1 - \frac{SUM}{\Delta\phi}\right)$$

Where
$T_c$=the period of the master clock signal;
SUM=the summed value stored in summer 14; and
$\Delta\phi$=frequency set value.

In order to determine the frequency set value to be provided by register 12, one need know the master clock frequency, the desired output frequency and the number of bits (m) defining the storage capacity of summer 14. With this information, the frequency set value can be determined from the following formula:

$$\Delta\phi = \frac{2^m f_o}{f_c}$$

Where
$f_c$=master clock frequency;
$f_o$=desired output frequency;
m=capacity in bits; and
$\Delta\phi$=frequency set value.

Figure 2:
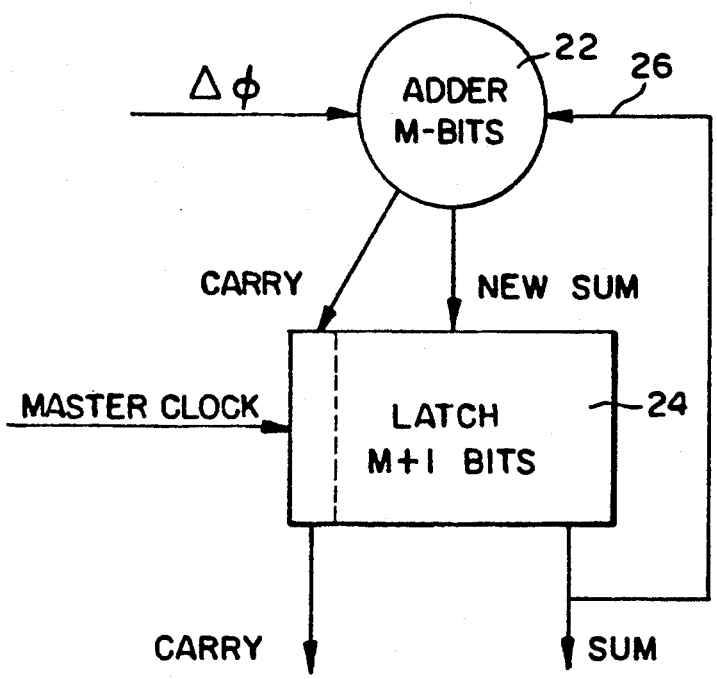
FIG. 2 is a schematic diagram of the preferred embodiment of the summer block depicted in FIG. 1.

Referring now to FIG. 2, the preferred embodiment of summer 14 is disclosed. Summer 14 is shown to include a binary adder 22, which is m bits wide, and a latch 24 which is m+1 bits wide. Adder 22 is connected to receive the $\Delta\phi$ signal. The $\Delta\phi$ signal is added to the summed value stored in latch 24 which is supplied to adder 22 at 26. In the preferred embodiment, the new summed value as determined by adder 22 is provided, in any acceptable manner, to the zero through m bits of latch 24. The m+1 bit of latch 24 is utilized for storage of the carry signal. It will be appreciated that the carry signal is generated by adder 22 whenever the new summed value exceeds the capacity of adder 22, i.e., a value greater than $2^m$. Latch 24 is updated for each pulse of the master clock signal. In this manner, the frequency set value is added to a summed value stored in latch 24 and provided to latch 24 as the new summed value. The new summed value will be stored in latch 24 upon receipt of the next pulse of the master clock signal.

Figure 3:
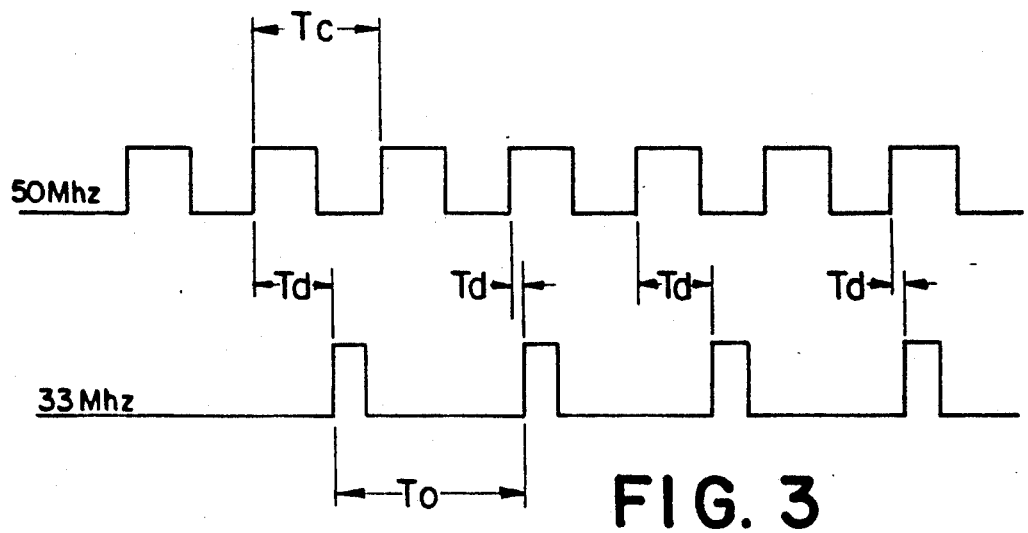
FIG. 3 is a timing diagram depicting the master clock signal and a clock signal output from the present invention.

The following example is provided to gain a more complete understanding of the present invention. It will be noted that although the preferred embodiment of summer 14 operates with digital representations, i.e., numbers in base 2, for ease of understanding this example deals with numbers in base 10. FIG. 3 depicts a timing diagram representative of this example.

TABLE 1

$f_c = 50$ MHZ ($T_c = 20$ ns)
$f_o = 33$ MHZ ($T_o = 30.303$ ns)
$M = 20$ bits

| CLOCK OUTPUT | CARRY? | SUM | DELAY $T_d$ |
|---|---|---|---|
| 1 | — | no 692060 | |
| 2 | 1 | yes 335544 | 10.303 ns |
| 3 | — | no 1027604 | |
| 4 | 2 | yes 671088 | 606.07 ps |
| 5 | 3 | yes 314572 | 10.909 ns |
| 6 | — | no 1006032 | |
| 7 | 4 | yes 630116 | 1.2121 ns |

Referring to Table 1 above, it is assumed that the master clock has a clock frequency of $f_c=50$ MHz, a desired output frequency of $f=33$ MHz and the storage capacity of adder 22 (summer 14) is $m=20$. The frequency set value ($\Delta\phi$) would be calculated as follows:

$$(\Delta\phi) = \frac{2^m (f_o)}{f_c} = \frac{2^{20} (33 \text{ MHz})}{50 \text{ MHz}} = 692060$$

On the first master clock pulse, $\Delta\phi$ having already been provided to adder 22, $\Delta\phi$ is stored in latch 24 as the summed value (SUM). Adder 22 then adds $\Delta\phi$ to SUM to get the new summed value (NEW SUM), which value will be stored in latch 24 on the next pulse of the master clock signal. The total 1384120, i.e., 692060+692060, is too large to be maintained in the 20-bit adder register of binary adder 22, since the largest number that can be maintained in 20-bits is $2^{20}$ or 1048576. Consequently, a carry signal is generated.

On the second master clock pulse, the NEW SUM and the carry signal are stored in latch 24. It will be appreciated that in operation, binary adder 22 will only retain that portion of the NEW SUM which is in excess of $2^{20}$. Consequently, the value stored in latch 24 as the summed value (SUM) will be 1384120-$2^{20}$, or 335544. This value is presented to variable delay 16. Since a carry signal has been generated, variable time delay clock generator 16 will generate a clock signal after a variable time delay. The time delay ($T_d$) is equal to:

$$T_c \left(1 - \frac{SUM}{\Delta\phi}\right) = 20 \text{ ns} \left(1 - \frac{335544}{692060}\right) = 10.303 \text{ ns}$$

An output pulse will be generated 10.303 ns following the next master clock pulse. Calculations for the first four output clock pulses are shown in Table 1. It should be noted that the possible output frequencies, in this example, extend from DC to 50 MHz and are spaced approximately 47.7 Hz apart as limited by the frequency resolution $f_c/2^m$.

Figure 4:
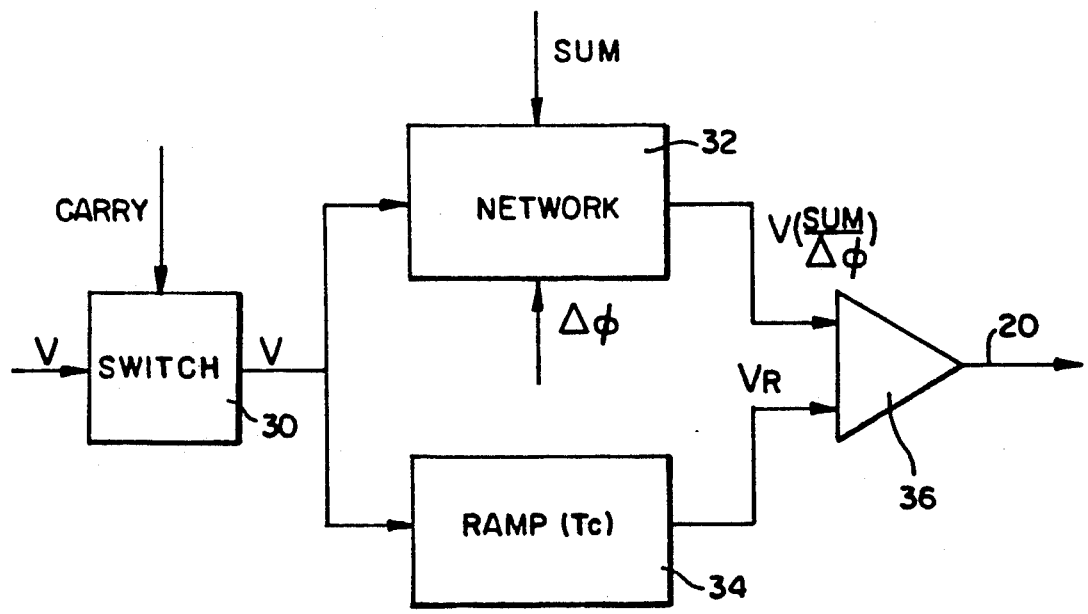
FIG. 4 is a schematic diagram of one possible embodiment of the variable time delay clock generator depicted in FIG. 1.

In FIG. 4, a schematic diagram depicting one possible embodiment of variable delay clock generator 16 is depicted. Although FIGS. 4 and 5 will be described first, it is noted that the preferred embodiment of variable delay clock generator 16 is depicted in FIG. 6. Clock generator 16 is shown to include a switch 30, a first circuit or network 32, a ramp circuit 34 and a comparator 36. The carry signal is provided to switch 30. In the preferred embodiment, the carry signal will either be a logic high or logic low value. When the carry signal is logic low, the voltage V will be prevented by switch 30 from being applied to network 32 or ramp 34. When the carry signal is logic high, switch 30 is enabled and voltage V is allowed to pass.

Ramp circuit 34 can be of any known design which is capable of generating a voltage which will ramp from V to zero in a time period equal to the master period of the master clock signal, i.e., $T_c$. Network 32 provides an output voltage V in proportion to the summed value divided by the set value, i.e., a voltage equal to V(SUM/$\Delta\phi$). The voltages output from network 32 and ramp 34 are provided as inputs to comparator 36.

When the voltage supplied by ramp 34 ($V_R$) equals or exceeds the voltage provided by network 32, comparator 36 will generate an output voltage which in the preferred embodiment will be a logic high signal. In other words, comparator 36 will generate a pulse at the conclusion of the required time delay ($T_d$). The output of comparator 36, if sufficient, can be utilized as the output voltage, or it may be desirable to provide a so-called "pull up voltage" in any known manner.

Figure 5:
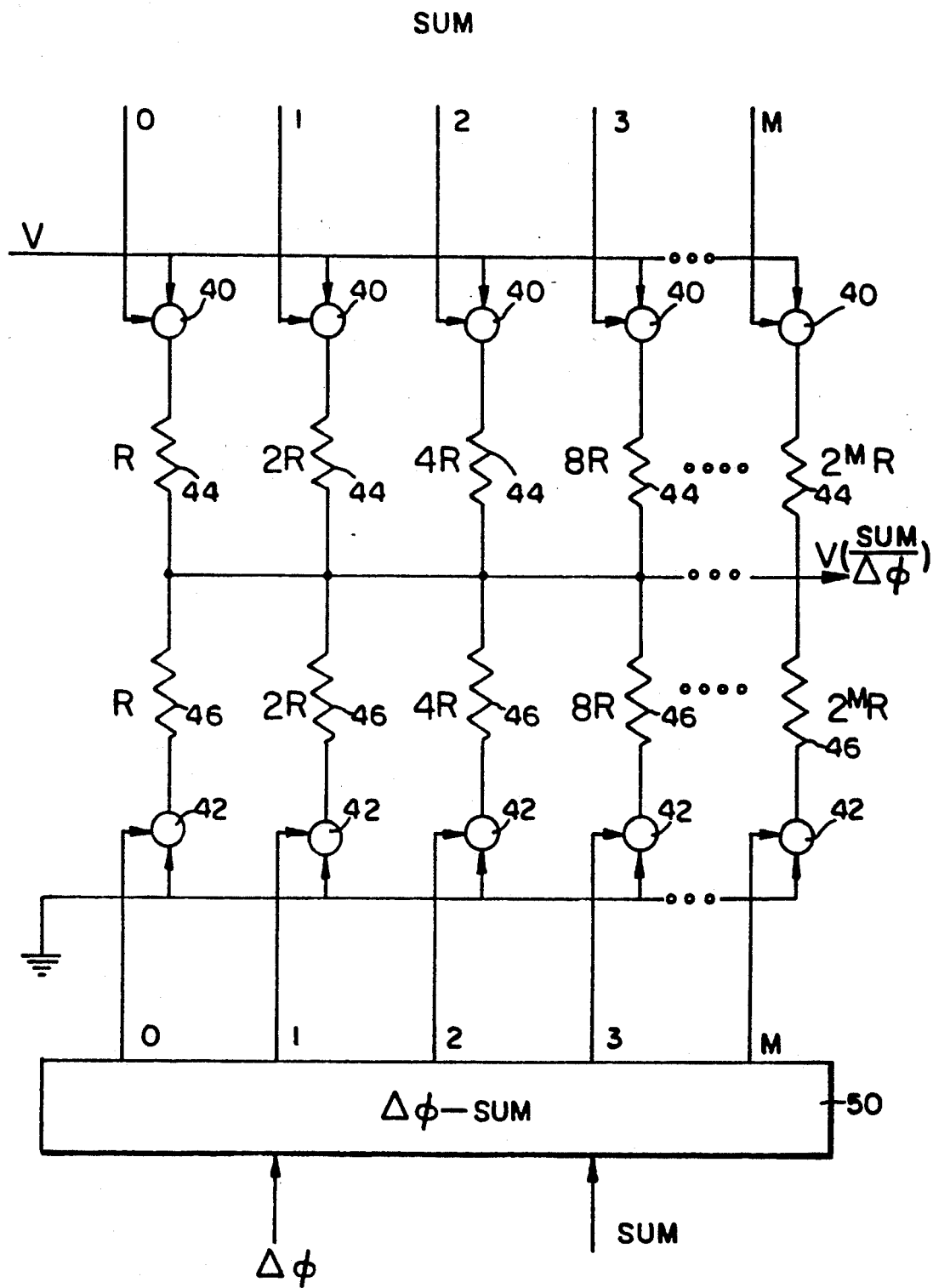
FIG. 5 is a schematic diagram of a circuit which can be used to generate the voltage V(SUM/$\Delta\phi$) for use in the circuit of FIG. 4.
Figure 6:
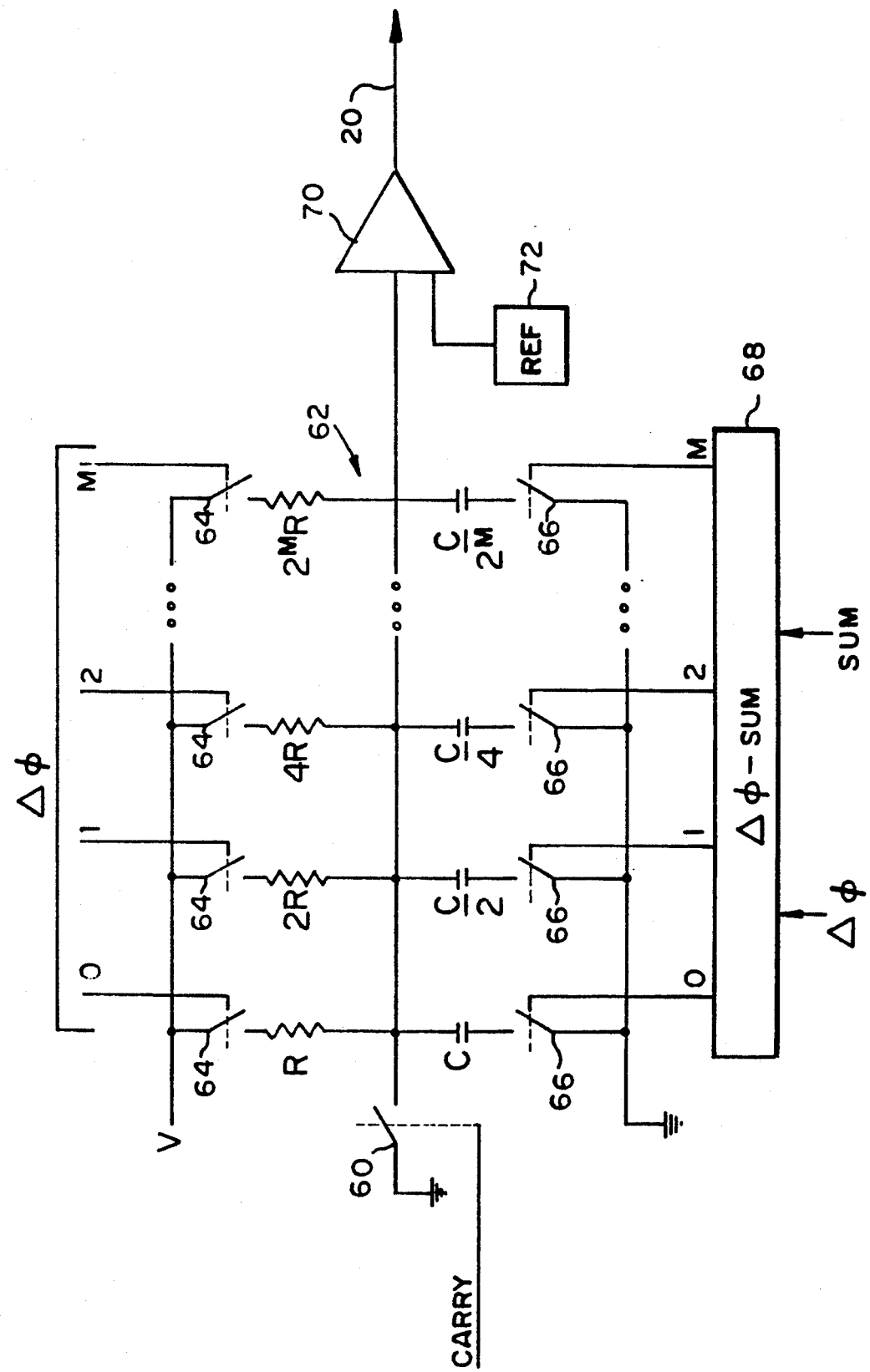
FIG. 6 is a schematic diagram of the preferred embodiment of the variable time delay clock generator depicted in FIG. 1.

Referring now to FIG. 5, a preferred embodiment of network 32 is depicted. Network 32 is shown to include a series of logic switches 40 and resistors 42 forming an elaborate voltage divider network. It will be recalled that the summed value is a digital number, i.e., each bit of the digital number will be either 1 or 0. If a 0 is provided to switches 40 or 42, the switch will remain closed. If a 1 or logic high is provided to switches 40 or 42, the switch will open allowing current to pass therethrough. As shown in FIG. 5, each bit of the summed value is provided to a separate switch 40, i.e., from the 0 th bit through the mth bit. A differencing circuit 50 is provided for determining the difference between the frequency set value ($\Delta\phi$) and the summed value. Each bit of this difference value is provided to a switch 42 from the 0 th bit through the mth bit. The bit connections of the summed value and the difference value are correspondingly connected. In other words, for example, the second bit of the summed value is connected to a switch 40 and if logic high allows the voltage V to pass through switch 40 and a resistor having the value 2R to a common bus. Likewise, the second bit of the difference value is applied to a switch 42, which if high, connects resistor 46 (2R) to ground. It will be noted that the resistance values increase in a digital fashion from the 0 th bit through the mth bit. In other words, the resistors are multiple values of some value R. For example, if R equals 1kΩ the 8R resistor will be equal to 8kΩ. In the example shown in Table 1, the resistor associated with the mth bit will be approximately 1,048.576 megaomhs. The output of the circuit shown in FIG. 5 is equal to the value V(SUM/$\Delta\phi$).

Referring now to FIG. 6, a schematic diagram depicting the preferred embodiment of variable delay clock generator 16 is depicted. Clock generator 16 is shown to include a switch 60 which is responsive to the carry signal. When closed, switch 60 connects RC network 62 to ground, thereby causing network 62 to charge. A plurality of switches 64 are interposed between the supply voltage V and individual resistors. It will appreciated that the resistors are binarily weighted in relation to one another. A second series of switches 66 are interposed between ground and the capacitors of network 62. It will be appreciated that the capacitors are also binarily weighted. Each switch 64 is connected to a separate bit of the frequency set value ($\Delta\phi$). It will be recalled that the frequency set value is a digital number, i.e., each bit will be either a 0 or 1. If a 0 is provided to switch 64, the switch remains closed. Conversely, if a 1 is provided to switch 64, the switch will open.

The differencing circuit 68 is provided for determining the difference between the frequency set value $\Delta\phi$ and the summed value. Each bit of this difference value is provided to a switch 66. Each of the capacitors are assumed to be initially discharged and it is within the scope of the invention for the inclusion of known circuits to accomplish such initial discharge. The output of network 62 is provided to one input of comparator 70. A reference voltage generated by reference member 72 is provided to the other input o comparator 70.

Consider now the circuits shown in FIG. 6 during operation. When a carry signal is generated, switch 60 opens allowing the voltage appearing at comparator 70 to charge in relation to an RC time constant set by the capacitors and resistors switched into network 62 by switches 64 and 66. The time constant established by network 62 is equal to the total resistance in the circuit given by $$\frac{2^{(M-1)} R}{\Delta\phi}$$

and multiplied by the total capacitance in the circuit which is given by $$\frac{(\Delta\phi - SUM)C}{2^{(M-1)}}$$

The resulting time constant for network 62 is thus $$RC\left(1 - \frac{SUM}{\Delta\phi}\right)$$

Comparator 70 is set to provide a clock signal output by adjusting the voltage provided by reference member 72 such that the voltage provided by network 62 will equal the reference voltage at exactly one master clock cycle or master period of delay between the condition where SUM=FREQUENCY SET ($\Delta\phi$), i.e., MINIMUM DELAY, and the condition where SUM=0—MAXIMUM DELAY. When the comparator output is thus adjusted, the delay programmed by the circuit shown in FIG. 6 is equal to:

$$Tc\left(1 - \frac{SUM}{\Delta\phi}\right) + C$$

where C is a fixed delay caused by circuit propagation and does not effect circuit operation.

Consider the following example where R in FIG. 6 equals 200 omhs and C in FIG. 6 equals 100 picofarads. The RC time constant of one R and one C is 20 nanoseconds (50 Mhz master clock frequency). Referring back to the second line of Table 1, a delay of 10.303 nanoseconds is needed with a SUM input of 335544 and a frequency set value of 692060. In the circuit shown in FIG. 6, the frequency set value will switch an equivalent resistance into the network of $2^{19}(200$ omhs$)/692060 = 151.52$ omhs. When the SUM is subtracted from the frequency set value, the result is 356516. Such a value switches in a capacitance of $356516 \times 100$ picofarads$/2^{19} = 68.00$ picofarads. The RC time constant is then (151.52 ohms) (68.00 picofarads)=10.303 nanoseconds which is the proper delay.

It is noted that in VLSI CMOS or bipolar integrated circuits, more than one network similar to that shown in FIG. 6 would be employed and multiplexed in order to give time for one circuit to "switch in" the appropriate resistance and capacitance while the other circuit is charging. In such devices, calibration networks that are based on the values SUM =0 and SUM=the frequency set value would be utilized together with circuits to automatically adjust reference member 72 by comparing their delays against the master clock signal. The use of such circuits would make the delay circuits relatively immune to supply, temperature and process variations.

While the invention has been described and illustrated with references to specific embodiments, those skilled in the art will recognize that modification and variations may be made without departing from the principles of the invention as described herein above and set forth in the following claims.

What is claimed is:

1. A fractional frequency synthesizer for generating a desired clock signal having a desired frequency in relation to the master frequency of a master clock signal, said master clock signal having a master period, said synthesizer comprising:
   a reference frequency register for providing a frequency set value, which frequency set value is proportional to said desired frequency;
   a summer, connected to receive said frequency set value and having a finite storage capacity, for adding the frequency set value to a summed value stored in said summer to form a new summed value in response to said master clock signal which new summed value is stored as the summed value, for generating a carry signal when said new summed value exceeds said finite storage capacity, wherein when said carry signal is generated only that portion of the new summed value in excess of said finite storage capacity is stored as the summed value; and
   a variable time delay clock generator, connected to said summer and to said reference frequency register, for generating said desired clock signal in response to said carry signal and for delaying each pulse by a delay period equal to said master period minus a fraction of said master period which fraction is proportional to the ratio of the summed value and the frequency set value, wherein said clock generator comprises delay means for both generating said delay period and for delaying each pulse by said delay period.

2. The synthesizer of claim 1, wherein said frequency set value is equal to the desired frequency divided by said master frequency times a constant, which constant is related to said finite storage capacity.

3. The synthesizer of claim 2, wherein said summer comprises a binary adder having a capacity of m bits and wherein said constant is equal to $2^m$.

4. The synthesizer of claim 1, wherein said fraction is equal to the summed value divided by the frequency set value.

5. The synthesizer of claim 1, wherein said summer comprises a binary adder having a capacity of m bits and a digital latch that is m+1 bits wide for storing said summed value and a carry signal, wherein said adder adds the frequency set value to the summed value stored in said latch to form said new summed value and generates a carry bit whenever said new summed value exceeds the m bit capacity of said adder and wherein said latch is updated in response to said master clock signal.

6. The synthesizer of claim 5, wherein said delay means comprises a delay device, triggered by said carry signal to generate, after said delay period, a logic signal at the output of said variable time delay clock generator.

7. The synthesizer of claim 6, wherein said delay device comprises a first circuit for generating a first voltage in proportion to said summed value divided by said set value, a second circuit for generating a second voltage equal to the ramping of said first voltage to ground in said master period and a comparator for comparing the proportional first voltage to said second voltage.

8. The synthesizer of claim 6, wherein said delay device comprises a first circuit for generating a first voltage in proportion to said summed value divided by said set value, wherein said first voltage varies over time, a reference supply for providing a reference voltage and a comparator for comparing the proportional first voltage to said reference voltage, wherein the reference voltage is set so that it takes one master period for the first voltage to equal the reference voltage.

9. The synthesizer of claim 8, wherein said first circuit comprises an RC network.

10. The synthesizer of claim 9, wherein said RC network further comprises a plurality of switches, wherein said switches switch in response to sum and said set value.

11. The synthesizer of claim 8, wherein said first circuit comprises an analog circuit.

12. A method for fractional frequency synthesizing whereby desired clock signal having a desired frequency is generated in proportion to the master frequency of a master clock signal, said master clock signal having a master period, said method comprising the steps of:

generating a frequency set value, which frequency set value is proportional to said desired frequency;

for adding the frequency set value to a summed value stored in a summer to form a new summed value in response to said master clock signal;

storing said new summed value in said summer, said summer having a finite storage capacity;

generating a carry signal when said new summed value exceeds said finite storage capacity, wherein when said carry signal is generated storing only that portion of the new summed value in excess of said finite storage capacity as the summed value; and generating said desired clock signal, wherein each pulse of said desired clock signal is generated in response to said carry signal, by generating a delay period equal to said master period minus a fraction of said master period which fraction is relative to both the summed value and the frequency set value and by delaying said desired clock signal by said delay period, wherein the generation of said delay period and the delaying of said desired clock signal occur in the same step.

13. The method of claim 12, frequency set value is equal to the desired frequency divided by said master frequency multiplied by a constant, which constant is related to said finite storage capacity.

14. The method of claim 13, wherein said summer comprises a binary adder having a capacity of m bits and wherein said constant is equal to $2^m$.

15. The method of claim 12, wherein said fraction is equal to the summed value divided by the frequency set value.

16. The method of claim 12, wherein said step of delaying each pulse by a delay period comprises the steps of generating a first voltage in proportion to said summed value divided by said set value, generating a second voltage equal to the ramping of said first voltage to ground in said master period and comparing the proportional first voltage to said second voltage, wherein said desired clock signal is generated in response to the comparing of said first and second voltages.

* * * * *